United States Patent
Schlaf et al.

(10) Patent No.: US 6,871,528 B2
(45) Date of Patent: Mar. 29, 2005

(54) METHOD OF PRODUCING A BRANCHED CARBON NANOTUBE FOR USE WITH AN ATOMIC FORCE MICROSCOPE

(75) Inventors: Rudiger Schlaf, Lutz, FL (US); Zhifeng F. Ren, Newton, MA (US); Jianguo Wen, Brookline, MA (US); David L. Carnahan, Needham, MA (US)

(73) Assignees: University of South Florida, Tampa, FL (US); Boston College, Chestnut Hill, MA (US); Nanolab, Inc., Newton, MA (US)

(*) Notice: Subject to any disclaimer, the term of this patent is extended or adjusted under 35 U.S.C. 154(b) by 0 days.

(21) Appl. No.: 10/413,598

(22) Filed: Apr. 14, 2003

(65) Prior Publication Data

US 2004/0009308 A1 Jan. 15, 2004

Related U.S. Application Data

(60) Provisional application No. 60/319,182, filed on Apr. 12, 2002.

(51) Int. Cl.[7] ............................ G01B 5/28; G01N 13/16
(52) U.S. Cl. ....................................................... 73/105
(58) Field of Search ............................ 73/105; 250/306, 250/307

(56) References Cited

U.S. PATENT DOCUMENTS

| | | | |
|---|---|---|---|
| 6,146,227 A | * 11/2000 | Mancevski | .................... 445/24 |
| 6,221,154 B1 | 4/2001 | Lee et al. | |
| 6,232,706 B1 | 5/2001 | Dai et al. | |
| 6,278,231 B1 | 8/2001 | Iwasaki et al. | |
| 6,322,713 B1 | 11/2001 | Choi et al. | |
| 6,325,909 B1 | 12/2001 | Li et al. | |
| 6,331,209 B1 | 12/2001 | Jang et al. | ..................... 117/90 |
| 6,346,189 B1 | * 2/2002 | Dai et al. | ................... 205/766 |
| 6,445,006 B1 | 9/2002 | Brandes et al. | |
| 6,451,175 B1 | 9/2002 | Lal | ............................ 204/173 |
| 6,457,350 B1 | * 10/2002 | Mitchell | ...................... 73/105 |
| 6,492,261 B2 | 12/2002 | Gavish et al. | |
| 2003/0059968 A1 | 3/2003 | Cheng et al. | |
| 2003/0143327 A1 | 7/2003 | Schlaf et al. | ............ 427/249.1 |
| 2003/0157744 A1 | 7/2003 | Schlaf et al. | |
| 2004/0022943 A1 | 8/2003 | Schlaf | |

FOREIGN PATENT DOCUMENTS

EP           1129990           5/2001

OTHER PUBLICATIONS

Cheung, C. L. et al., "Carbon Nanotube Atomic Force Microscopy Tips: Direct Growth by Chemical Vapor Deposition and Application to High–Resolutioin Imaging", PNAS, vol. 97, No. 8, Apr. 11, 2000, pp. 3809–3813.*

Cheung, C. L. et al., "Growth and Fabrication with Single–Walled Carbon Nanotube Probe Microscopy Tips", Applied Physics Letters, vol. 76, No. 21, May 22, 2000, pp. 3136–3138.*

Dai, H. et al., Nanotubes as Nanoprobes in Scanning Probe Microscopy, Nature, vol. 384, 1996. pp. 147–151. ☐☐.*

(Continued)

Primary Examiner—Daniel S. Larkin
(74) Attorney, Agent, or Firm—Howard & Howard

(57) ABSTRACT

A method of producing a branched carbon nanotube (CNT) is disclosed. The branched CNT is used with an atomic force microscope having a cantilever and a tip and that is able to measure a surface of a substrate as well as an undercut feature of the substrate that protrudes from the surface. A catalytic material is deposited onto the tip of the microscope, and the catalytic material is subjected to chemical vapor deposition. This initiates growth of a primary branch of the branched carbon nanotube such that the primary branch extends from the tip. A secondary branch is then introduced to extend from the primary branch and produce the branched carbon nanotube. The primary branch interacts with the surface of the substrate and the secondary branch interacts with the undercut feature.

32 Claims, 4 Drawing Sheets

OTHER PUBLICATIONS

Nagy, G. et al., "Carbon Nanotube Tipped Atomic Force Microscopy for Measurement of <100 nm Etch Morphology on Semiconductors", Applied Physics Letters, vol. 73, No. 4, Jul. 27, 1998, pp. 529–531.*

Stevens, R. M. D. et al., "Carbon Nanotubes as Probes for Atomic Force Microscopy", Nanotechnology, vol. 11, 2000, pp. 1–5.*

Wong, S. S. et al., "Carbon Nanotube Tips: High–Resolution Probes for Imaging Biological Systems", J. Am. Chem. Soc.; vol. 120, 1998, pp. 603–604.*

Publication: "Growth of a Single Freestanding Mutiwall Carbon Nanotube On Each Nanonickel Dot"; published in Applied Physics Letters, vol. 75, No. 8, dated Aug. 23, 1999.

Publication: "High–Yield Assembly Of Individual Single–Walled Carbon Nanotube Tips For Scanning Probe Microscopies"; published in The Journal Of Physical Chemistry B, vol. 105, No. 4, Feb. 1, 2001.

Paper on "AFM and STM Investigation Of Carbon Nanotubes Produced By High Energy Ion Irradiation Of Graphite"; Journal Name: Nuclear Instruments & Methods In Physics Research, Section B (Beam Interactions with Materials and Atoms), Jan. 1, 1999, vol. 147, No. 1–4, Corporate Author —Res. Inst. For Tech. Phys. & Mater. Sci., Budapest Hungary.

Paper on "Electrical Transport In Pure And Boron–Doped Carbon Nanotubes"; Journal Name: Applied Physics Letters, May 24, 1999, vol. 74, No. 21, Corporate Author —Inst. fur Metallkunde, Stuttgart Univ., Germany.

Paper on "Chemical Vapor Deposition Of Novel Carbon materials"; Journal Name: Thin Solid Films, Jun. 15, 2000, vol. 368, No. 2, Corporate Author —Dept. of Phys., Univ. of Central Florida, Orlando, FL. USA.

Paper on "Temperature Dependence Of The Resistivity Of Individual Multi–Walled Pure/Boron Doped Carbon Nanotubes At Elevated Temperatures"; Journal Name: AIP Conference Proceedings, 1999, vol. 486, pp. 371–4, Corporate Author —Max–Planck–Inst. fur Metallforschung, Stuttgart, Germany.

Paper on "Synthesis And Characterization of B(X)C(Y)N(Z) Nanatubes (Boron Carbonitride, Young's Modulus)", 1996, vol. 58–02B, pp. 762, Corporate Author —University of California, Berkeley.

Paper on "High–Yield Assembly Of Individual Single–Walled Carbon Nanotube Tips for Scanning Probe Microscopies"; Journal Name: Journal of Physical Chemistry B, Feb. 1, 2001, vol. 105, No. 4, Corporate Author —Dept. of Chem. & Chem. Biol., Harvard Univ., Cambridge, MA, USA.

U.S. Appl. No. 10/413,621, filed Apr. 14, 2003, which claims the benefit of U.S. Provisional Appl. No. 60/319,183, filed on Apr. 12, 2002.

U.S. Appl. No. 10/310,219 filed Dec. 5, 2002 Schlaf et al. entitled "Method For Producing A Carbon Nanotube".

U.S. Appl. No. 10/313,866 filed Dec. 6, 2002 Schlaf et al. entitled "Method Of Producing An Integrated Circuit With A Carbon Nanotube".

U.S. Appl. No. 10/413,597 filed Apr. 14, 2003 Schlaf entitled "A Carbon Nanotube Tweezer And A Method Of Producing The Same".

* cited by examiner

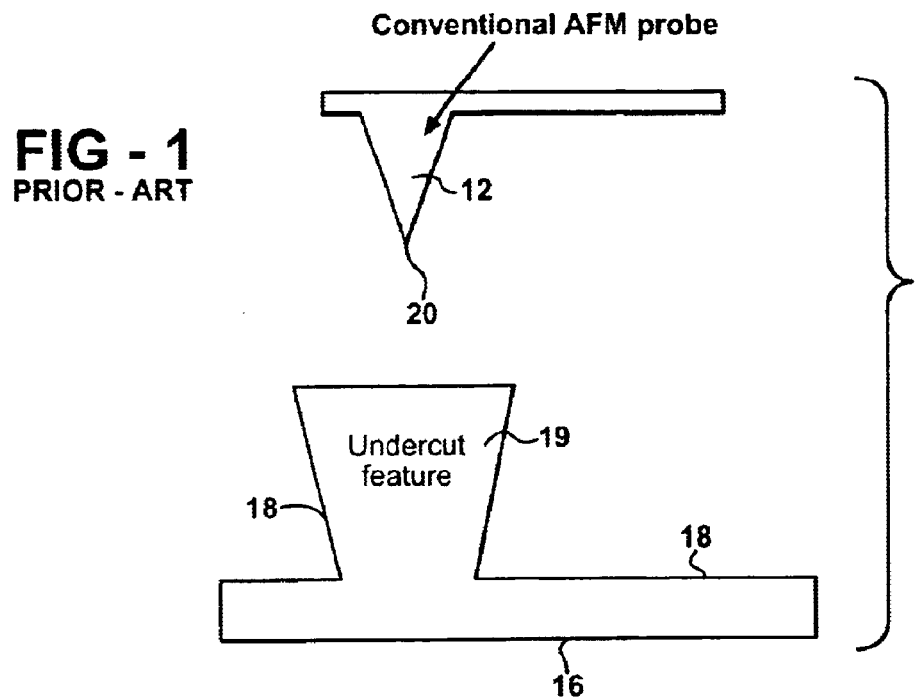
FIG - 1
PRIOR - ART
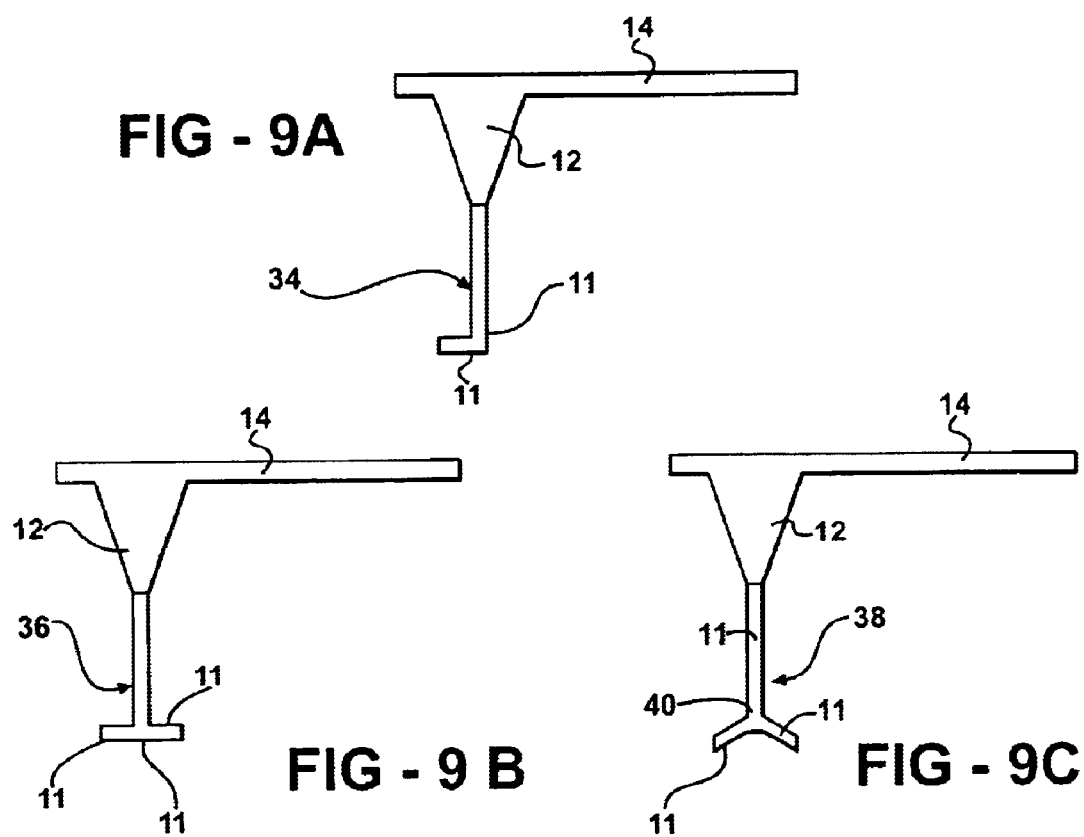
FIG - 9A
FIG - 9 B
FIG - 9C

METHOD OF PRODUCING A BRANCHED CARBON NANOTUBE FOR USE WITH AN ATOMIC FORCE MICROSCOPE

RELATED APPLICATIONS

This patent application claims priority to and all advantages of U.S. Provisional Patent Application No. 60/319,182, which was filed on Apr. 12, 2002.

BACKGROUND OF THE INVENTION

1. Field of the Invention

The subject invention generally relates to a method of producing a branched carbon nanotube (CNT). More specifically, the subject invention relates to a method of producing a branched CNT for use with an atomic force microscope (AFM) that is capable of measuring, i.e., dimensionally characterizing, a surface of a substrate as well as measuring an undercut feature that protrudes from the surface of the substrate.

2. Description of the Related Art

The related art includes many known methods for producing branched, specifically T-shaped, probes for use with AFMs. These convention methods produce a silicon-based probe that is used with the AFM to measure a surface of a substrate as well as an undercut feature that protrudes from the surface of the substrate. However, silicon-based probes are prone to failure due to various stress and strain issues that ultimately cause the silicon to fracture. Therefore, AFMs that utilize such silicon-based probes are able not able to, over time, adequately measure the surface or the undercut feature of the substrate. Furthermore, other related are probes used with AFMs are insufficient in that they do not include branching, i.e., a branched probe. As a result, these conventional AFMs are unable to dimensionally characterize the undercut feature that protrudes from the surface of the substrate. As example of such a conventional AFM is disclosed in FIG. 1, labeled Prior Art.

The related art is characterized by one or more inadequacy primarily due to its reliance on silicon-based probes and their tendency to fracture. Therefore, it would be advantageous to provide a method of producing a branched carbon nanotube for use with an AFM.

SUMMARY OF THE INVENTION AND ADVANTAGES

A method of producing a branched carbon nanotube is disclosed. The branched carbon nanotube produced according to the subject invention is used with an atomic force microscope that measures a surface of a substrate and an undercut feature that protrudes from the surface. The atomic force microscope includes a cantilever having a tip.

The method includes the step of depositing a catalytic material onto the tip of the atomic force microscope and the step of subjecting, i.e., exposing, the catalytic material to chemical vapor deposition. Upon subjecting the catalytic material to chemical vapor deposition, growth of a primary branch of the branched carbon nanotube is initiated such that the primary branch extends from the tip. A secondary branch of the branched carbon nanotube is also introduced. This secondary branch extends from the primary branch and produces the branched carbon nanotube. The primary branch of the branched carbon nanotube interacts with the surface of the substrate and the secondary branch of the branched carbon nanotube interacts with the undercut feature.

The branched carbon nanotube produce according to the method of the subject invention overcomes the inadequacies of the prior art methods. More specifically, the material properties of branched carbon nanotubes are superior as compared to the silicon-based probes utilized in the prior art. The branched carbon nanotubes have extreme mechanical strength and increased stability at the tip of the cantilever of the atomic force microscope. Furthermore, the branched carbon nanotube enables the AFM to repeatedly measure both the surface of the substrate and the undercut feature of the substrate with significant durability and over a long period of time without failure of the branched carbon nanotube.

BRIEF DESCRIPTION OF THE DRAWINGS

Other advantages of the present invention will be readily appreciated as the same becomes better understood by reference to the following detailed description when considered in connection with the accompanying drawings wherein:

FIG. 1 is a side view illustrating a prior art probe of an atomic force microscope that is unable to measure an undercut feature that protrudes from a surface of a substrate due to the probe's lack of branching;

FIG. 9A is a side view illustrating a branched CNT produced according to the method of the subject invention, specifically a branched CNT that is generally L-shaped, that is able to adequately measure the undercut feature of the substrate;

FIG. 9B is a side view illustrating another branched CNT produced according to the method of the subject invention, specifically a branched CNT that is generally T-shaped, that is able to adequately measure the undercut feature of the substrate; and FIG. 9C is a side view illustrating another branched CNT produced according to the method of the subject invention, specifically a branched CNT that is generally Y-shaped, that is able to adequately measure the undercut feature of the substrate.

DETAILED DESCRIPTION OF THE PREFERRED EMBODIMENT

Referring to the Figures, wherein like numerals indicate like or corresponding parts throughout the several views, a method for producing a branched carbon nanotube (CNT) 11 is disclosed. The branched CNT 11 produced according to the method of the subject invention includes a primary branch, a secondary branch, and optionally, a tertiary branch. These branches are described below. By use of the terminology branch, it is to be understood that there is no requirement that the secondary branch extend perpendicular to the primary branch. Instead, the branches can be more integral to one another where the branched CNT 11 appears more like a curve than an L- or T-shape.

Figure 2:
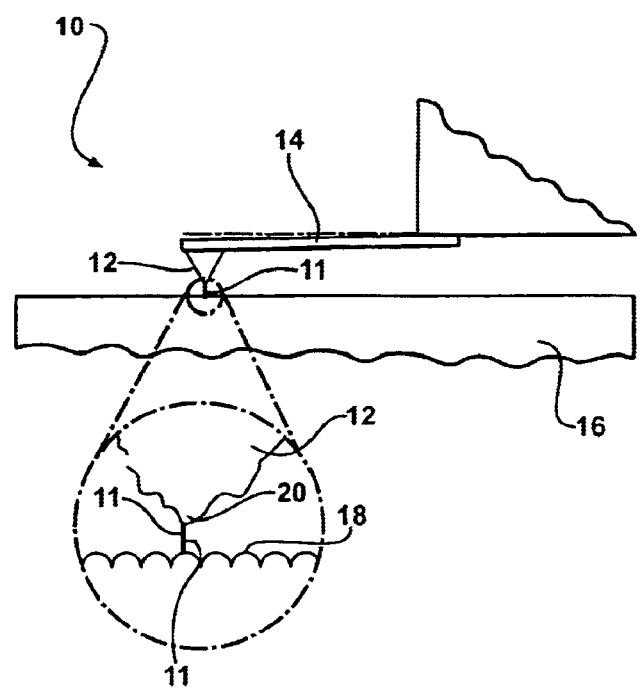
FIG. 2 is a side view of an atomic force microscope having a carbon nanotube (CNT) attached to an apex of a tip of a cantilever.

The branched CNT 11 is for use with an atomic force microscope (AFM) 10 as shown generally in FIG. 2. However, the branched CNT 11 may also be used on other devices for manipulating nanoparticles. The AFM 10 includes a cantilever 14 having a tip 12 that may, or may not, culminate with an apex 20. For example, in FIGS. 1–8 the tip 12 culminates with the apex 20. However, in FIGS. 9A–9C, the tip 12 is truncated and does not culminate with the apex 20. In other words, in these Figures, the tip 12 is frustoconical. The existence or non-existence of the apex 20 does not affect the scope of the subject invention.

Generally, the method includes the steps of depositing a catalytic material 22 onto 20 of the tip 12 of the AFM 10, and subjecting, i.e., exposing, the catalytic material 22 to chemical vapor deposition (CVD) to initiate growth of the primary branch of the branched CNT 11 such that the primary branch extends from the tip 12. Throughout the description herein, the catalytic material 22 may also be referred to as catalyst 22 and catalyst material 22.

The AFM 10 is a mechano-optical instrument, which detects atomic-level forces through optical measurements of movements of the branched CNT 11 on a tip 12 of a cantilever 14 as the branched CNT 11 passes over a substrate 16. AFM 10 is a method of measuring, i.e., dimensionally characterizing, topography of a surface 18 of the substrate 16 on a scale from angstroms to one hundred microns. The branched CNT 11 is held several nanometers above the surface 18 using a feedback mechanism that measures surface 18 and tip 12 interactions on the scale of nanoNewtons. The branched CNT 11 produced according to the method of the subject invention enables the AFM 10 to measure the surface 18 as well as an undercut feature 19 that protrudes from the surface 18 of the substrate 16. More specifically, unlike an un-branched CNT, the branched CNT 11 of the subject invention is able to effectively interact with the undercut feature 19.

In one sense, the subject invention is directed towards a variety of ways to initiate selective growth of a branched CNT 11 on the tip 12 of the AFM 10 cantilever 14. An isolated small patch of catalyst 22 material is deposited at the tip 12 of the cantilever 14 where the branched CNT 11 can be grown by CVD. The catalyst 22 includes, but is not limited to, Ni, Co, Fe, and combinations thereof.

CVD is a chemical reaction that transforms gaseous molecules, called precursors, into a solid material, in the form of thin film, on the surface of the cantilever 14. Many different precursors may be utilized with the subject invention. Common gaseous precursors are selected from the group consisting of hydrides, halides, metal-organics, and combinations. The gaseous precursors suitable for use with the present invention are not limited to those listed above. Suitable metal-organics include, but are not limited to, metal alkyls, metal alkoxides, metal dialkylamides, metal diketonates, or metal carbonyls, and combinations thereof.

The CVD is carried out in a reactor. Most reactors include gas and vapor delivery lines, a reactor main chamber having a hot wall and a cold wall. The reactor also includes substrate loading and unloading assembly for positioning the substrate within the reactor.

The reactor also includes an energy source(s). Typical examples of energy sources include resistive heating, radiant heating, and inductive heating. Resistive heating includes energy from a tube furnace or a quartz tungsten halogen lamp. Radiant heating provides energy from radio-frequency and inductive heating provided energy from a laser as a thermal energy source. Yet another energy source is photo energy from an UV-visible light laser.

The products from the CVD include a solid and a gas product. The solid gas products include thin films and powders. The thin films may be metals, alloys, ceramics and polymeric materials. The gas products are volatile byproducts and are always formed. The gas products generated in CVD processes are usually hazardous and must be disposed of accordingly.

Another type of CVD is plasma enhanced CVD (PECVD). PECVD is performed in a reactor at temperatures up to ~1000° C. The deposited film is a product of a chemical reaction between the source gases supplied to the reactor. A plasma is generated in the reactor to increase the energy available for the chemical reaction at a given temperature. The system for carrying out the PECVD is similar to that described above for CVD.

Figure 3:
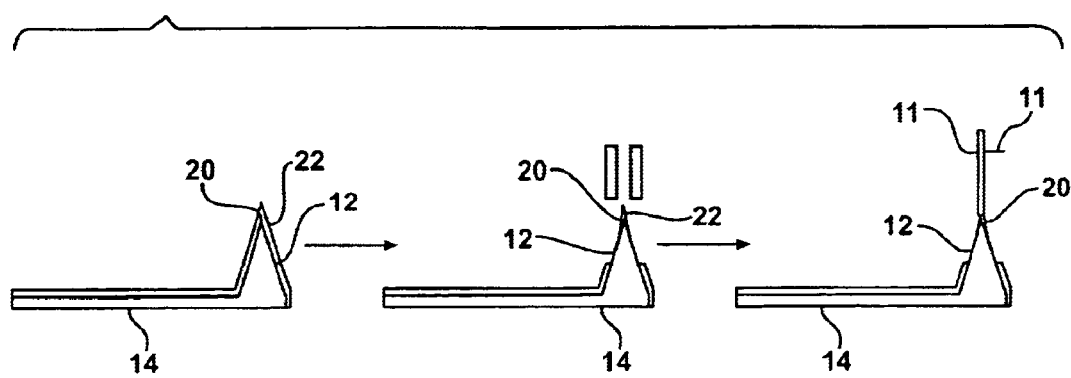
FIG. 3 is an illustration of the subject invention depicting a method of growing the CNT on the cantilever.

The subject invention, as shown in FIG. 3, includes a method of coating the regular cantilever 14 with the catalyst 22 material. Then a focused ion-beam (FIB) technique is used to remove the catalyst 22 below the apex 20 of the cantilever 14. As described elsewhere herein, the FIB technique is utilized for many purposes in the present invention. For example, the FIB technique is utilized to deposit, remove, and cut various components, such as the catalytic material 22 or the tip 12. As a specific example, the FIB technique may be used to deposit the catalytic material 22 onto the tip 12 to begin the production of the branched CNT 11. The FIB technique is understood by those skilled in the art. In the embodiment of FIG. 3, the FIB does not remove the catalyst 22 from the very top of the apex 20. The FIB uses an ion beam to expose the surface of a sample by removing material from the sample with surgical precision. The FIB techniques may also be used to deposit material, such as the catalytic material 22, with the same precision as removing, and is described further below. Next, the catalyst 22 is subjected to either CVD or PECVD, and the CVD or the PECVD is used to grow the branched CNT 11 on the spared catalyst 22 patch resulting in a branched CNT 11 standing on the apex 20.

Figure 4:
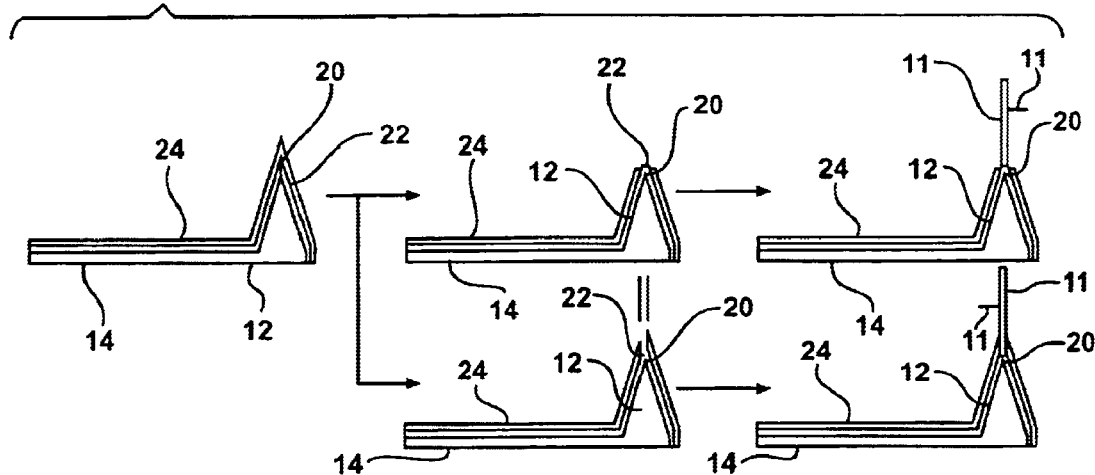
FIG. 4 is an illustration of the subject invention depicting another method of growing the CNT on the cantilever.

Another embodiment of the subject invention, illustrated in FIG. 4, coats the cantilever 14 with the catalyst 22 and a masking layer 24 consisting of a material not catalytically active for branched CNT 11 growth. More specifically, the masking layer 24 is selected from the group consisting of $SiO$, $SiO_2$, $SiO_3$, $SiO_4$, Cr, and combinations thereof. Then FIB is used to cut off the top of the apex 20, exposing a patch of the catalyst 22 material. Alternately, the FIB may cut a hole through the masking layer 24 at the apex 20 resulting in exposed catalyst 22 at a bottom of the hole. After the catalyst 22 has been exposed, CVD or PECVD is used to grow branched CNTs 11 from the exposed catalyst 22 areas.

Figure 5:
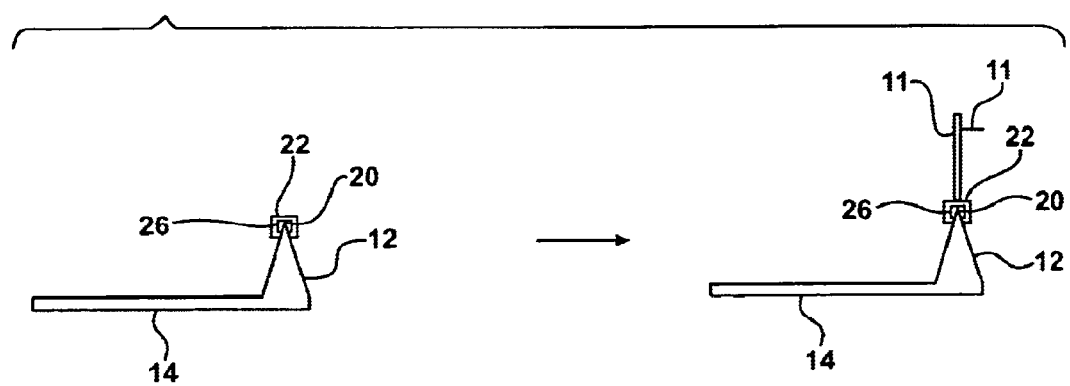
FIG. 5 is an illustration of the subject invention depicting a yet another method of growing the CNT on the cantilever.

Yet another embodiment of the subject invention, illustrated in FIG. 5, uses an electroless plating technique to selectively deposit a patch of catalyst 22 at the end of the apex 20 of the tip 12 of the standard cantilever 14. The selectivity is accomplished by FIB assisted deposition of a material 26 on the apex 20 or tip 12. The material 26 sensitizes the electroless plating process, which is chemically tuned not to coat the bare cantilever 14 material. After the FIB deposition, catalyst 22 is electrolessly deposited on top of the sensitizing material 26 but not on the other parts of the cantilever 14. Then CVD or PECVD are used to grow the branched CNT 11 on the catalyst 22 patch.

Figure 6:
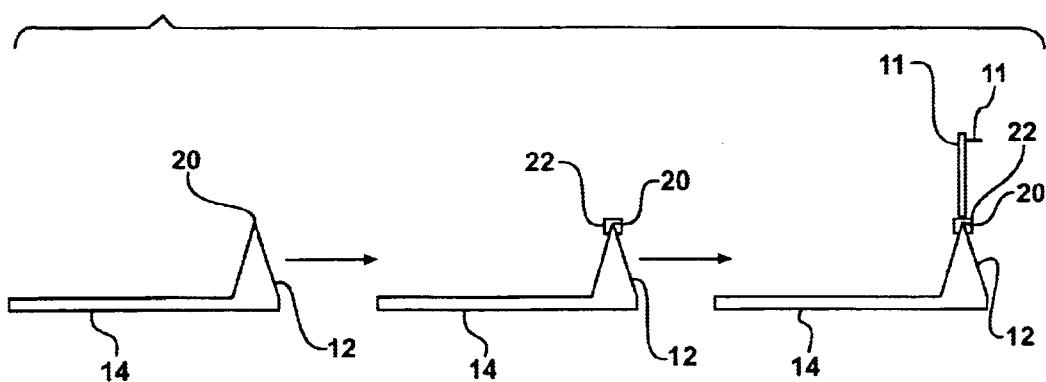
FIG. 6 is an illustration of the subject invention depicting still another method of growing the CNT on the cantilever.

Referring to FIG. 6, still another embodiment of the subject invention is illustrated. A suitable precursor containing catalyst 22 material such as organometallic compounds is selected and applied to the cantilever 14. Next, the FIB is used to directly coat the apex 20 of the cantilever 14 with a patch of catalyst 22 material. The branched CNT 11 is then grown directly on that patch by CVD or PECVD.

Figure 7:
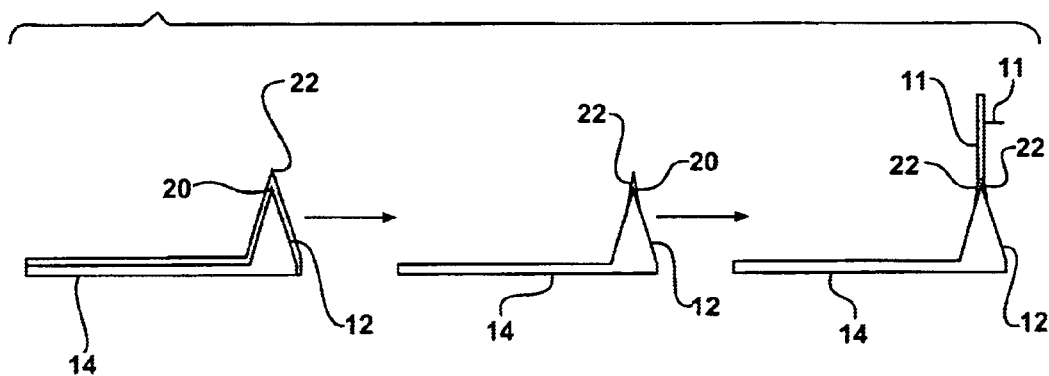
FIG. 7 is an illustration of the subject invention depicting still a further method of growing the CNT on the cantilever.

Lastly, the subject invention provides still a further embodiment by coating the regular cantilever 14 with catalyst 22 material using a deposition source positioned directly in a line-of-sight above the apex 20 of the tip 12, as shown in FIG. 7. The position of the deposition source directly in line with the apex results in a thinner coating on the slopes of the tip 12 than on the apex 20 and the cantilever 14 beam. Then, the catalyst 22 layer is etched chemically or electrochemically until the catalyst 22 is removed from the tip 12 slopes but some catalyst 22 remains on top of the apex 20 and the flat areas of the cantilever 14 beam. Then CVD or PECVD are used to grow a branched CNT 11 on the spared catalyst 22 patch resulting in a branched CNT 11 standing on the apex 20.

Figure 8:
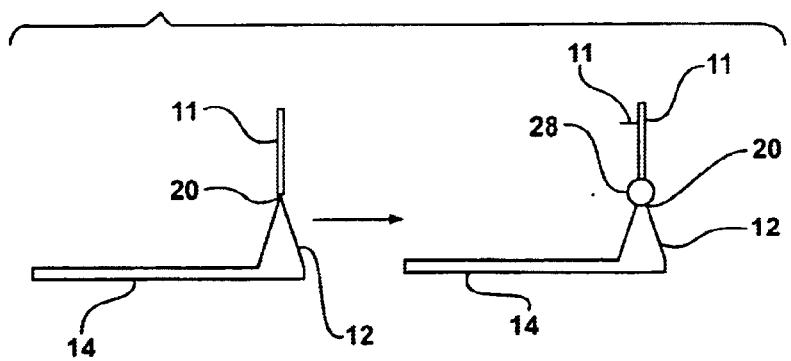
FIG. 8 an illustration depicting a method strengthening the CNT grown on the cantilever yielding extended stability.

Referring to FIG. 8, any of the above embodiment may further a step of increasing the rigidity of the branched CNT 11. More specifically, the rigidity of either the primary branch, the secondary branch, or both the primary and secondary branches can be increased. Using the FIB, a suitable material 28, for example Pt, is deposited around the area where the branched CNT 11 is attached to the original cantilever 14, i.e., onto the tip 12. The suitable material 28 will enhance the mechanical attachment of the branched CNT 11 to the apex 20 of the cantilever 14 and enhance the lifetime of the branched CNT 11 during scanning operation.

It is to be understood that the subject method invention may also include the step of controlling an angle that the branched CNT 11 grows at relative to the apex 20 of the tip 12. This step may be necessary if it is desirable to provide an offset for any tilt of the cantilever 14. More specifically, an electric field is applied as the catalytic material 22 is subjected to CVD to control the angle.

The diameter of the branched CNT 11 and the number of walls present in the branched CNT 11 may also be controlled. To control these features of the branched CNT 11, an amount of the catalytic material 22 that is deposited onto the tip 12 is controlled. This varies the diameter of the branched CNT 11 and can also vary the number of walls of the branched CNT 11. A length of the branched CNT 11 can also be varied. To vary the length of the branched CNT 11, a duration of the CVD, or PECVD, is controlled.

Referring more specifically to FIGS. 9A–9B, the method of the subject invention produces the branched CNTs 11. The catalytic material 22 is deposited onto the tip 12 of the AFM 10. The catalytic material 22 is then subjected to CVD to initiate growth of the primary branch of the branched CNT 11 such that the primary branch extends from the tip 12. The secondary branch of the branched CNT 11 is introduced to extend from the primary branch and produce the branched CNT 11. The secondary branch of the branched CNT 11 may be introduced during the growth of the primary branch of after the growth of the primary branch. The primary branch of the CNT 11 interacts with the surface 18 of the substrate 16 and the secondary branch of the branched CNT 11 interacts with the undercut feature 19.

An electrical field may be applied during growth of the primary branch to control a primary growth direction of the primary branch extending from the tip of the AFM 10. In this case, to introduce the secondary branch of the branched CNT 11, a relative direction of the electrical field is altered to introduce the secondary branch of the branched CNT 11 such that the secondary branch extends from the primary branch in a secondary growth direction that is different from the primary growth direction. The relative direction of the electrical field may be altered in a variety of different manners.

In one embodiment, field electrodes, which are responsible for generating the electrical field, may be rotated during growth of the primary branch. In a further embodiment, the field electrodes may be rotated after growth of the primary branch. In yet a further embodiment, the surface 18 of the substrate 16 may be angled relative to the applied electrical field.

Referring to FIG. 9A, the branched CNT 11 is generally L-shaped (as represented by 34 in FIG. 9A). To achieve this L-shape, the electrical field is applied during growth of the primary branch to control the primary growth direction of the primary branch as it extends from the tip 12 of the AFM 10. Next, the relative direction of the electrical field is altered by 90° to introduce the secondary branch of the L-shaped, branched CNT 11. This secondary branch extends from the primary branch in a secondary growth direction that is 90° different from the primary growth direction. More specifically, to alter the electrical field by 90°, the field electrodes are rotated by 90°, or the surface 18 of the substrate 16 is angled by 90° relative to the applied electrical field. The L-shape enables this branched CNT 11 to measure dimensions of the undercut feature 19 of the substrate 16 when it is used on the AFM 10.

Referring now to FIG. 9B, to form a generally T-shaped, branched CNT 11, a second catalytic material, such as nickel, may be deposited at an intersection of the primary and secondary branches of the L-shaped, branched CNT 11. Then, this second catalytic material is subjected to CVD to initiate growth of a tertiary branch. This tertiary branch extends parallel to the secondary branch and perpendicular to the primary branch. An additional electrical field may be utilized to control the growth of the tertiary branch. As a result of the growth of the tertiary branch, the branched CNT 11, which was originally generally L-shaped, becomes generally T-shaped (as represented by 36 in FIG. 9B). The T-shape enables this branched CNT 11 to measure dimensions of the undercut feature 19 of the substrate 16 when it is used on the AFM 10.

Referring now to FIG. 9C, the branched CNT 11 is generally Y-shaped (as represented by 38 in FIG. 9C). A branching point 40 is introduced on the primary branch after the catalytic material 22 has been subjected to the CVD to initiate growth of the primary branch, but before the secondary branch of the branched CNT 11 has been introduced. Next, in this embodiment, the secondary branch is introduced to extend from the primary branch at the branching point 40. Additionally, the tertiary branch of this embodiment, i.e., the other shorter leg of the "Y", is also introduced to extend from the primary branch at the branching point 40 simultaneously with the introduction of the secondary branch. Of course, as disclosed in FIG. 9C, the secondary and the tertiary branch extend from the branching point 40 in different directions. As a result, the branched CNT 11 is generally Y-shaped. The Y-shape enables this branched CNT 11 to measure dimensions of the undercut feature 19 of the substrate 16 when it is used on the AFM 10.

It is to be understood that the primary branch of the branched CNT 11 can take different forms that effects the definition what is to be considered the secondary branch.

This is merely a descriptive issue that does not vary the scope of the subject invention. As one example, with a generally L-shaped CNT 11, the primary branch of the branched CNT 11 may be straight and the secondary branch may be the short leg that extends from the primary branch to complete the L-shape. On the other hand, in another example where the branched CNT 11 is generally T-shaped, this branched CNT 11 can be described to include a primary branch, a secondary branch, and a tertiary branch (as set forth above). However, the generally T-shaped, branched CNT 11 may also be described to include a primary branch that is L-shaped, and the secondary branch may be the additional short leg that extends from the other short leg of the L to complete the T-shape.

Obviously, many modifications and variations of the present invention are possible in light of the above teachings. The invention may be practiced otherwise than as specifically described within the scope of the appended claims.

What is claimed is:

1. A method of producing a branched carbon nanotube for use with an atomic force microscope that measures a surface of a substrate and an undercut feature protruding from the surface, wherein the atomic force microscope includes a cantilever having a tip, said method comprising the steps of:

depositing a catalytic material onto the tip of the contilever;

subjecting the catalytic material to chemical vapor deposition to initiate growth of a primary branch of the branched carbon nanotube such that the primary branch extends from the tip; and introducing a secondary branch of the branched carbon nanotube to extend from the primary branch and produce the branched carbon nanotube with the primary branch of the branched carbon nanotube interacting with the surface of the substrate and the secondary branch of the branched carbon nanotube interacting with the undercut feature.

2. A method as set forth in claim 1 wherein the step of introducing the secondary branch of the branched carbon nanotube is further defined as introducing the secondary branch of the branched carbon nanotube during growth of the primary branch.

3. A method as set forth in claim 1 wherein the step of introducing the secondary branch of the branched carbon nanotube is further defined as introducing the secondary branch of the branched carbon nanotube after growth of the primary branch.

4. A method as set forth in claim 1 further comprising the step of applying an electrical field during growth of the primary branch to control a primary growth direction of the primary branch extending from the tip of the cantilever.

5. A method as set forth in claim 4 wherein the step of introducing the secondary branch of the branched carbon nanotube is further defined as altering a relative direction of the electrical field to introduce the secondary branch of the branched carbon nanotube extending from the primary branch in a secondary growth direction that is different from the primary growth direction.

6. A method as set forth in claim 5 wherein the step of altering the relative direction of the electrical field is further defined as rotating field electrodes during growth of the primary branch.

7. A method as set forth in claim 5 wherein the step of altering the relative direction of the electrical field is further defined as rotating field electrodes after growth of the primary branch.

8. A method as set forth in claim 5 wherein the step of altering the relative direction of the electrical field is further defined as angling the surface of the substrate relative to the applied electrical field.

9. A method as set forth in claim 1 wherein the branched carbon nanotube is generally L-shaped.

10. A method as set forth in claim 9 further comprising the step of applying an electrical field during growth of the primary branch to control a primary growth direction of the primary branch extending from the tip of the cantilever.

11. A method as set forth in claim 10 wherein the step of introducing the secondary branch of the L-shaped, branched carbon nanotube is further defined as altering a relative direction of the electrical field by 90° to introduce the secondary branch of the L-shaped, branched carbon nanotube extending from the primary branch in a secondary growth direction that is 90° different from the primary growth direction.

12. A method as set forth in claim 11 wherein the step of altering the relative direction of the electrical field by 90° is further defined as rotating field electrodes by 90°.

13. A method as set forth in claim 11 wherein the step of altering the relative direction of the electrical field by 90° is further defined as angling the surface of the substrate by 90° relative to the applied electrical field.

14. A method as set forth in claim 9 further comprising the step of depositing a second catalytic material at an intersection of the primary and secondary branches of the L-shaped, branched carbon nanotube.

15. A method as set forth in claim 14 further comprising the step of subjecting the second catalytic material to chemical vapor deposition to initiate growth of a tertiary branch such that the tertiary branch extends parallel to the secondary branch and perpendicular to the primary branch.

16. A method as set forth in claim 15 further comprising the step of applying an additional electrical field during growth of the tertiary branch to control growth of the tertiary branch.

17. A method as set forth in claim 15 wherein the L-shaped, branched carbon nanotube becomes generally T-shaped as a result of the growth of the tertiary branch.

18. A method as set forth in claim 1 wherein the branched carbon nanotube is generally Y-shaped.

19. A method as set forth in claim 1 further comprising the step of introducing a branching point on the primary branch alter the catalytic material has been subjected to the chemical vapor deposition to initiate growth of the primary branch, but before the secondary branch of the branched carbon nanotube has been introduced.

20. A method as set forth in claim 19 wherein the step of introducing the secondary branch of the branched carbon nanotube is further defined as introducing the secondary branch of the branched carbon nanotube to extend from the primary branch at the branching point.

21. A method as set forth in claim 20 further comprising the step of introducing a tertiary branch of the branched carbon nanotube to extend from the primary branch at the branching point simultaneously with the introduction of the secondary branch, wherein the secondary branch and the tertiary branch extend from the branching point in different directions.

22. A method as set forth in claim 21 wherein the branched carbon nanotube is generally Y-shaped.

23. A method as set forth in claim 1 wherein the step of depositing the catalytic material onto the tip is further defined as depositing a catalytic material selected from the group consisting of nickel, cobalt, iron, and combinations thereof.

24. A method as set forth in claim 1 wherein the step of subjecting the catalytic material to chemical vapor deposition comprises the step of transforming a gaseous precursor selected from the group consisting of hydrides, halides, metal-organics, and combinations thereof into a solid material.

25. A method as set forth in claim 1 wherein the step of subjecting the catalytic material to chemical vapor deposition is further defined as subjecting the catalytic material to plasma enhanced chemical vapor deposition.

26. A method as set forth in claim 1 wherein the step of depositing the catalytic material onto the tip is further defined as depositing the catalytic material onto the tip using focused ion beam deposition.

27. A method as set forth in claim 1 further comprising the step of depositing a sensitizing material onto the tip prior to deposition of the catalytic material onto the tip.

28. A method as set forth in claim 1 wherein the step of depositing the catalytic material onto the tip comprises the step of controlling an amount of the catalytic material that is deposited onto the tip to vary at least one of a diameter of the branched carbon nanotube and a number of walls present in the branched carbon nanotube.

29. A method as set forth in claim 1 wherein the step of subjecting the catalytic material to chemical vapor deposition comprises the step of controlling a duration of the chemical vapor deposition to vary a length of the branched carbon nanotube.

30. A method as set forth in claim 1 further comprising the step of increasing the rigidity of at least one of the primary branch and the secondary branch.

31. A method as set forth in claim 30 wherein the step of increasing the rigidity of at least one of the primary branch and the secondary branch is further defined as increasing the rigidity of the primary branch.

32. A method as set forth in claim 31 wherein the step of increasing the rigidity of the primary branch is further defined as depositing platinum onto the tip prior to deposition of the catalytic material onto the tip.

* * * * *

UNITED STATES PATENT AND TRADEMARK OFFICE
CERTIFICATE OF CORRECTION

PATENT NO.    : 6,871,528 B2
DATED         : March 29, 2005
INVENTOR(S)   : Rudiger Schlaf et al.

It is certified that error appears in the above-identified patent and that said Letters Patent is hereby corrected as shown below:

<u>Column 7,</u>
Line 26, after "tip of the" delete "contilever" and insert therein -- cantilever --.

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,871,528 B2  Page 1 of 1
APPLICATION NO. : 10/413598
DATED : March 29, 2005
INVENTOR(S) : Rudiger Schlaf et al.

It is certified that error appears in the above-identified patent and that said Letters Patent is hereby corrected as shown below:

Column 1, line 5, after the title, please insert the following paragraph:

GOVERNMENT LICENSE RIGHTS

[0001] This invention was made with Government support under Contract No. DAAD16-00-C-9227 awarded by the United States Army Natick Soldier System Center. The Government may have certain rights in the invention.

Signed and Sealed this

Fifteenth Day of April, 2008

JON W. DUDAS
*Director of the United States Patent and Trademark Office*